US012648263B2

(12) United States Patent
Cho et al.

(10) Patent No.: US 12,648,263 B2
(45) Date of Patent: Jun. 2, 2026

(54) LIGHT-EMITTING ELEMENT, LIGHT-EMITTING MODULE AND DISPLAY BACKLIGHT UNIT

(71) Applicant: EPISTAR CORPORATION, Hsinchu (TW)

(72) Inventors: Heng-Ying Cho, Hsinchu (TW); Wei-Ting Chang, Hsinchu (TW); Yi-Hung Lin, Hsinchu (TW)

(73) Assignee: ENNOSTAR CORPORATION, Hsinchu (TW)

( * ) Notice: Subject to any disclaimer, the term of this patent is extended or adjusted under 35 U.S.C. 154(b) by 385 days.

(21) Appl. No.: 18/516,747

(22) Filed: Nov. 21, 2023

(65) Prior Publication Data

US 2024/0170610 A1    May 23, 2024

(30) Foreign Application Priority Data

Nov. 22, 2022    (TW) ................................. 111144670

(51) Int. Cl.
| | |
|---|---|
| *H10H 20/814* | (2025.01) |
| *H10H 20/82* | (2025.01) |
| *H10H 20/857* | (2025.01) |
| *H10H 29/14* | (2025.01) |

(52) U.S. Cl.
CPC .......... *H10H 20/814* (2025.01); *H10H 20/82* (2025.01); *H10H 20/857* (2025.01); *H10H 29/14* (2025.01)

(58) Field of Classification Search
None
See application file for complete search history.

(56) References Cited

U.S. PATENT DOCUMENTS

| | | | |
|---|---|---|---|
| 10,158,047 B2 | 12/2018 | Jeon et al. | |
| 2016/0149086 A1* | 5/2016 | Sim ...................... | H10H 20/841 |
| | | | 257/98 |
| 2017/0331009 A1* | 11/2017 | Shioji ................ | H10H 20/8515 |
| 2024/0030210 A1* | 1/2024 | Jeong ................... | H10H 29/142 |

FOREIGN PATENT DOCUMENTS

JP         2009164506 A      7/2009

* cited by examiner

*Primary Examiner* — Hung K Vu
(74) *Attorney, Agent, or Firm* — Patterson + Sheridan, LLP

(57) ABSTRACT

A light-emitting device includes a semiconductor stack, an insulating reflective structure having an opening, and an electrode located on the insulating reflective structure and filled in the opening to electrically connect to the semiconductor stack. The semiconductor stack having includes a main surface, and a side surface inclined to the main surface. The light-emitting device has a dominant wavelength and a peak wavelength. The insulating reflective structure includes: a first part located on the main surface and having a first thickness; and a second part located on the side surface and having a second thickness different from the first thickness. The second part of the insulating reflective structure has a reflectivity of more than 90% for the dominant wavelength or the peak wavelength within an incident angle of 0° to 30°.

20 Claims, 11 Drawing Sheets

LIGHT-EMITTING ELEMENT, LIGHT-EMITTING MODULE AND DISPLAY BACKLIGHT UNIT

CROSS-REFERENCE TO RELATED APPLICATIONS

This disclosure claims the right of priority of TW Application No. 111144670 filed on Nov. 22, 2022, and the content of which is hereby incorporated by reference in its entirety.

BACKGROUND

Technical Field

The present disclosure relates to a semiconductor stack, in specific, to a semiconductor stack including an insulating reflective structure.

Description of the Related Art

The light-emitting diode (LED) is a sort of solid-state semiconductor element, which has the advantages of low power consumption, low heat generation, long lifetime, shockproof, small size, high response speed, and good optical-electrical characteristics like stable emission wavelength. Therefore, light-emitting diodes have been widely applied to household appliances, equipment indicator lights, optoelectronic products, and so forth.

A conventional LED includes a substrate. An n-type semiconductor layer, an active layer and a p-type semiconductor layer are formed on the substrate. A p-electrode and an n-electrode are respectively formed on the n-type semiconductor layer and the p-type semiconductor layer. By applying a certain forward voltage to the light-emitting diode devices via the electrodes, holes from the p-type semiconductor layer and electrons from the n-type semiconductor layer are combined in the active region so as to emit light. While the size of the light-emitting diode device becomes smaller, how to keep good optoelectronic characteristics thereof and improve the dicing yield concerns people in the present technology field.

SUMMARY

A light-emitting device includes a semiconductor stack, an insulating reflective structure, an opening formed in the insulating reflective structure, and an electrode located on the insulating reflective structure and filled in the opening to electrically connect to the semiconductor stack. The semiconductor stack includes a main surface, a bottom surface and a side surface between the main surface and the bottom surface. The side surface is inclined to the main surface and has an acute included angle with 0 degrees with the bottom surface. The insulating reflective structure covers the semiconductor stack and includes a first stack and a second stack. The first stack includes one or more first insulating pairs each composed of a first sub-layer and a second sub-layer. The second stack includes one or more second insulating pairs each composed of a third sub-layer and a fourth sub-layer. The first sub-layer and the second sub-layer include different materials. The third sub-layer and the fourth sub-layer include different materials. A thickness of the first sub-layer is less than that of the third sub-layer. A thickness of the second sub-layer is less than that of the fourth sub-layer. The light-emitting device has a dominant wavelength and a peak wavelength. The insulating reflective structure includes a first part and a second part. The first part is located on the main surface and has a first thickness. The second part is located on the side surface and has a second thickness different from the first thickness. The second part of the insulating reflective structure has a reflectivity of more than 90% for the dominant wavelength or the peak wavelength within an incident angle of 0° to 30°.

A light-emitting device includes a semiconductor stack, an insulating reflective structure covering the semiconductor stack, an opening formed in the insulating reflective structure and an electrode formed on the insulating reflective structure and filled in the opening to electrically connect to the semiconductor stack. The semiconductor layer includes a main surface, a bottom surface and a side surface between the main surface and the bottom surface. The side surface is inclined to the main surface and has an acute included angle with 0 degrees with the bottom surface. The insulating reflective structure includes a first stack and a second stack. The first stack includes a plurality of first sub-layers and a plurality of second sub-layers alternately stacked with the first sub-layers. The second stack includes a plurality of third sub-layers and a plurality of fourth sub-layers alternately stacked with the third sub-layers. The first sub-layers and the second sub-layers include different materials. The third sub-layers and the fourth sub-layers include different materials. The thickness of the first sub-layer is less than that of the third sub-layer. The thickness of the second sub-layer is less than that of the fourth sub-layer. The adjacent first sub-layer and second sub-layer form a first insulating material pair. The adjacent third sub-layer and fourth sub-layer form a second insulating material pair. The insulating reflective structure includes a first part located on the main surface and a second part located on the side surface. An average thickness of the first insulating material pairs in the first part is d1, and an average thickness of the second insulating material pairs in the second part is d2'. The difference between d1 and d2' is less than 10%.

DETAILED DESCRIPTION OF THE EMBODIMENTS

In order to make the description of the present application more detailed and complete, please refer to the description of the following embodiments and cooperate with the relevant illustrations. However, the examples shown below are used to illustrate the light-emitting device of the present application, and the present application is not limited to the following embodiments. In addition, the dimensions, materials, shapes, relative arrangements, etc., of the elements described in the embodiments in this specification are not limited to the description, and the scope of the present application is not limited to these, but is merely a description. In addition, the size or positional relationship of the elements shown in each figure is exaggerated for clear description. Furthermore, in the following description, in order to appropriately omit detailed descriptions, elements of the same or similar nature are shown with the same names and symbols.

Figure 1A:
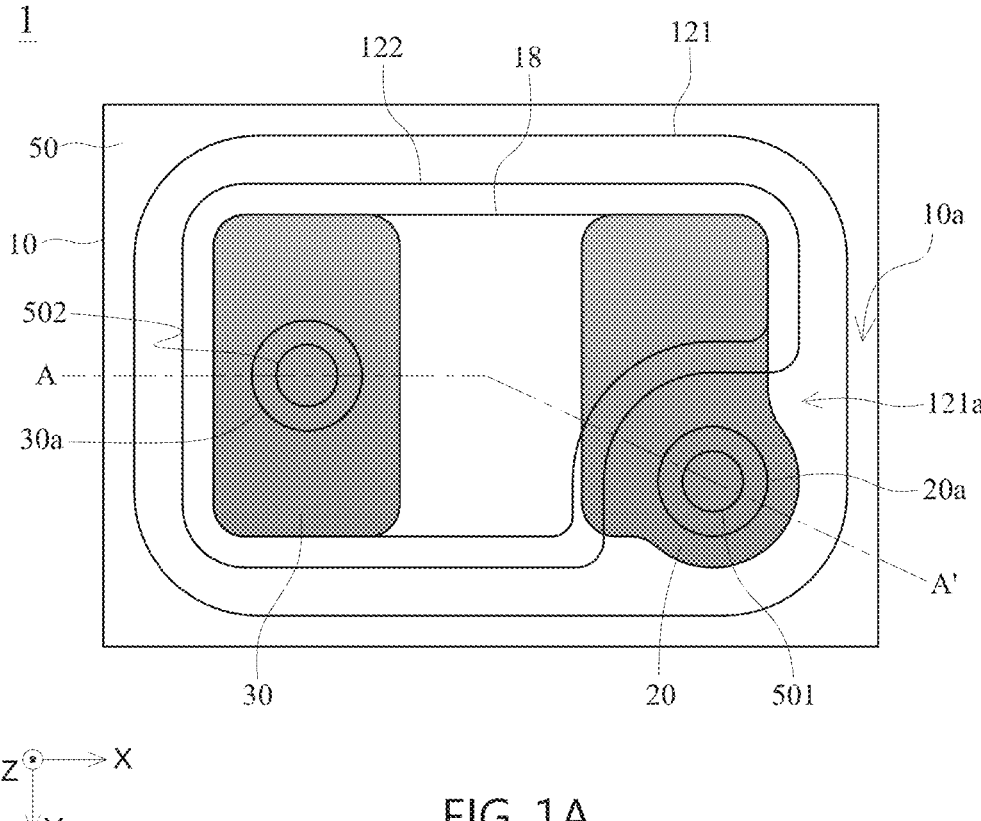
FIG. 1A shows a top view of a light-emitting device in accordance with an embodiment of the present application.
Figure 1B:
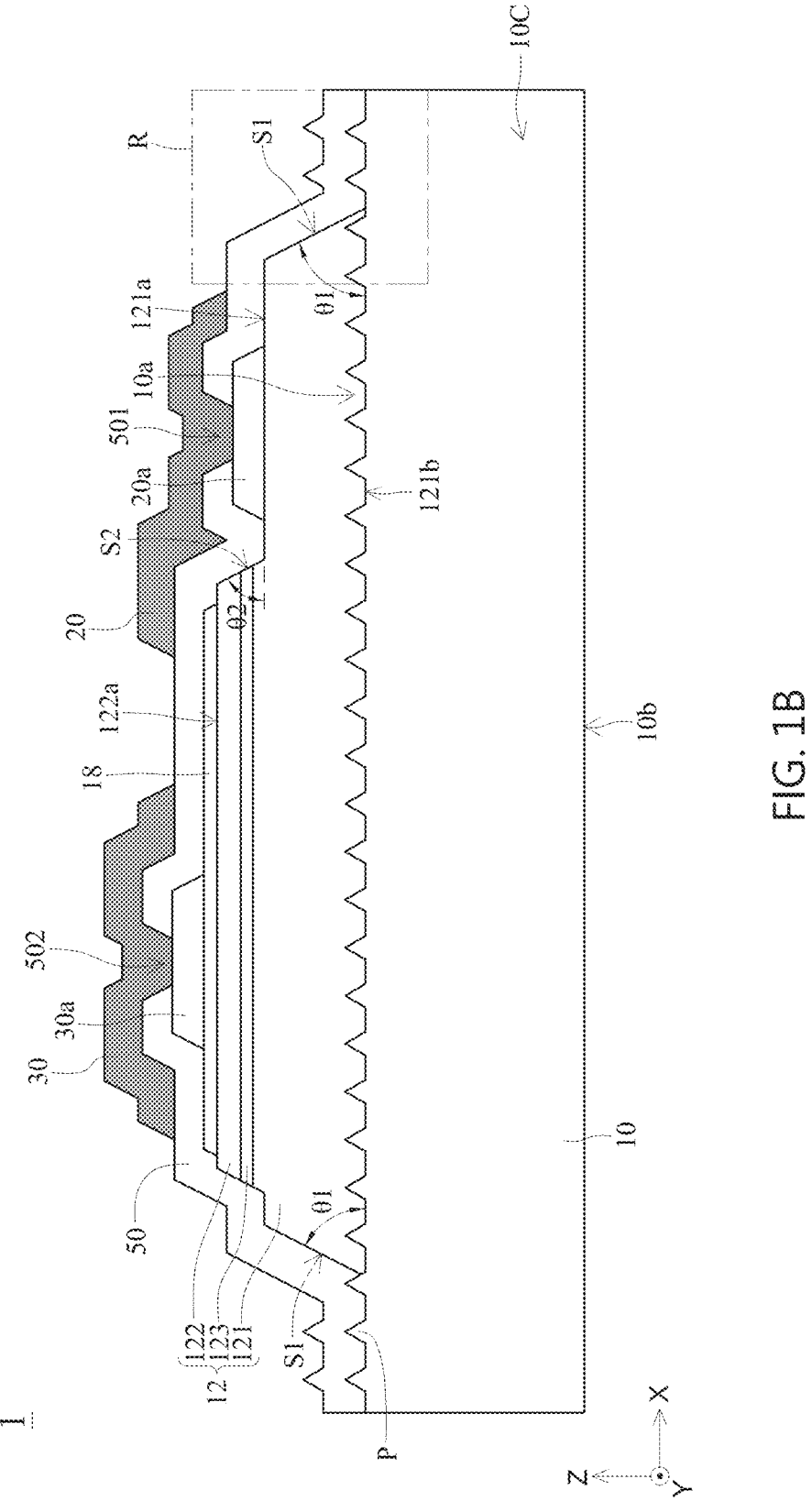
FIG. 1B shows a cross-section view along a line AA' in FIG. 1A.
Figure 1C:
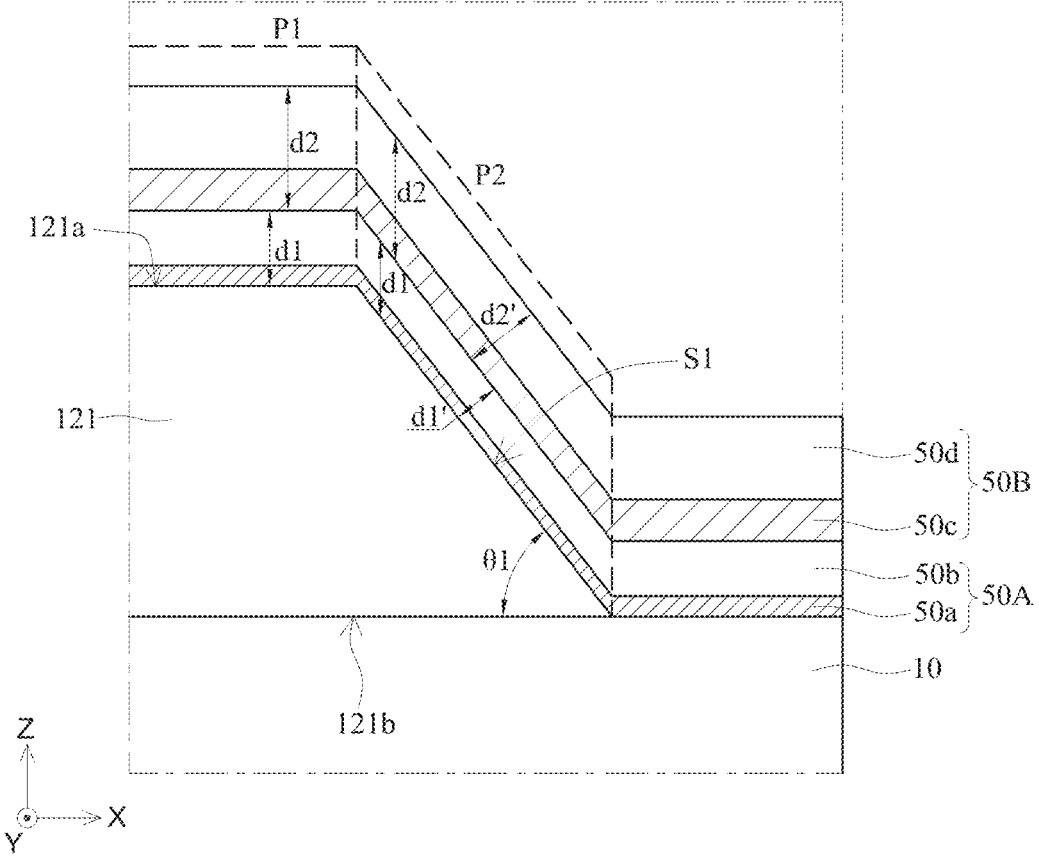
FIG. 1C shows a partial enlarged view of region R in FIG. 1B.

FIG. 1A shows a top view of a light-emitting device in accordance with an embodiment of the present application. FIG. 1B shows a cross-section view along a line A-A' in FIG. 1A. FIG. 1C shows a partial enlarged view of region R in FIG. 1B.

As shown in FIG. 1A and FIG. 1B, the light-emitting element 1 includes a substrate 10 and a semiconductor stack 12 located on an upper surface 10a of the substrate 10. From bottom to top the semiconductor stack 12 includes a first semiconductor layer 121, an active layer 123 and a second semiconductor layer 122 in sequence. The first semiconductor layer 121 includes a first semiconductor layer main surface 121a parallel to the XY plane and not covered by the active layer 123 and the second semiconductor layer 122, and the semiconductor stack 12 further includes a bottom surface 121b opposite to the first semiconductor layer main surface 121a. The light-emitting element 1 further includes a first contact electrode 20a located on the first semiconductor layer main surface 121a of the first semiconductor layer 121 and electrically connecting to the first semiconductor layer 121. The light-emitting element 1 further includes a transparent conductive layer 18 and a second contact electrode 30a located on and electrically connecting to the second semiconductor layer 121. The light-emitting element 1 further includes an insulating material stack 50 covering the semiconductor stack 12, the first contact electrode 20a, the second contact electrode 30a and the transparent conductive layer 18. The insulating material stack 50 has an opening 501 and an opening 502 respectively exposing the first contact electrode 20a and the second contact electrode 30a. The light-emitting element 1 further includes a first electrode pad 20 and a second electrode pad 30. The first electrode pad is located on the insulating material stack 50 and filled in the opening 501 to connect to the first contact electrode 20a. The second electrode pad 30 is located on the insulating material stack 50 and filled in the opening 502 to connected to the second contact electrode 30a.

The substrate 10 may be a growth substrate including a gallium arsenide (GaAs) substrate for growing gallium indium phosphide (AlGaInP) and a gallium phosphide (GaP) substrate. Alternatively, in order to grow indium gallium nitride (InGaN) or Aluminum gallium (AlGaN), the growth substrate may include a sapphire ($Al_2O_3$) substrate, gallium nitride (GaN) substrate, silicon carbide (SiC) substrate, or aluminum nitride (AlN) substrate. In an embodiment, the substrate 10 may be a patterned substrate, that is, the substrate 10 has a patterned structure P on the upper surface 10a. The light emitted from the semiconductor stack 12 may be refracted and/or reflected by the patterned structure P of the substrate 10, thereby increasing the brightness of the light emitting device 1. In addition, the patterned structure P eases or suppresses the dislocation caused by lattice mismatch between the substrate 10 and the semiconductor stack 12, thereby improving the epitaxial crystal quality of the semiconductor stack 12.

In another embodiment, the patterned structure P and the substrate 10 include different materials. The patterned structure P includes, for example, an insulating material, such as silicon oxide, silicon nitride, or silicon oxynitride. In an embodiment, the region of the upper surface 10a not covered by the semiconductor stack 12 does not have the patterned structure P, and the region of the upper surface 10a covered by the semiconductor stack 12 has the patterned structure P. In another embodiment, the size, width, shape or height of the patterned structure P in the region of the upper surface 10a not covered by the semiconductor stack 12 are different from those of the patterned structure P in the region of the upper surface 10a covered by the semiconductor stack 12. For example, the patterned structure P in the region not covered by the semiconductor stack 12 has a smaller size and a smaller height than those of the patterned structure P in the region covered by the semiconductor stack 12. In another embodiment, the upper surface 10a of the substrate 10 does not have the patterned structure P.

In an embodiment of the present application, the way for forming the semiconductor stack 12 on the substrate 10 may include metal organic chemical vapor deposition (MOCVD), molecular beam epitaxy (MBE), hydride vapor deposition (HVPE) or ion plating, such as sputtering or evaporation.

In an embodiment, the semiconductor stack 12 includes a buffer structure (not shown) located between the first semiconductor layer 121 and the substrate 10. The buffer structure may reduce the lattice mismatch and ease dislocations, thereby improving the epitaxial crystal quality. The buffer structure may include GaN, AlGaN or AlN. In an embodiment, the buffer structure includes two sub-layers, such as a first sub-layer and a second sub-layer formed by different ways. For example, the first sub-layer may be formed by sputtering, and the second sub-layer may be formed by MOCVD. In an embodiment, the buffer structure may further include a third sub-layer formed by MOCVD. The growth temperature of the second sub-layer is different from that of the third sub-layer. In an embodiment, the first sub-layer, the second sub-layer and the third sub-layer may include the same material, such as AlN. In an embodiment, the first semiconductor layer 121 and the second semiconductor layer 122 are cladding layers or confinement layers. In an embodiment, the first semiconductor layer 121 and the second semiconductor layer 122 have different conductive type, electricity, polarization, or doping elements. For example, the first semiconductor layer 121 includes n-type semiconductors, and the second semiconductor layer 122 includes p-type semiconductors. The active layer 123 is formed between the first semiconductor layer 121 and the second semiconductor layer 122. By a driving current, electrons and holes may be combined in the active layer 123, thereby converting electrical energy into light energy to emit light. The wavelength of the light emitted by the light-emitting element 1 or the semiconductor stack 12 may be adjusted by changing the physical properties and chemical composition of one or more layers of the semiconductor stack 12.

The material of the semiconductor stack 12 includes a group III-V compound semiconductor material, such as $Al_xIn_yGa_{(1-x-y)}N$ or $Al_xIn_yGa_{(1-x-y)}P$, wherein $0<x$, $y<1$; $(x+y)<1$. According to the material of the active layer, when the material of the semiconductor stack 12 is AlInGaP series material, red light having a wavelength between 610 nm and 650 nm or yellow light having a wavelength between 550 nm and 570 nm can be emitted. When the material of the semiconductor stack 12 is InGaN series material, blue or deep blue light having a wavelength between 400 nm and 490 nm or green light having a wavelength between 490 nm and 550 nm can be emitted. When the material of the semiconductor stack 12 is AlGaN series material, UV light having a wavelength between 400 nm and 250 nm can be emitted. The active layer 123 can be a single heterostructure (SH), a double heterostructure (DH), a double-side double heterostructure (DDH), or a multi-quantum well structure (MQW). The material of the active layer can be i-type, p-type, or n-type semiconductor.

A transparent conductive layer 18 covers the second semiconductor layer 122 to spread current and forms ohmic contact with the second semiconductor layer 122. The transparent conductive layer 18 is transparent to the light emitted by the active layer 123 and, for example, has a transmittance of more than 80%. The transparent conductive layer 18 can be metal or a metal oxide. The metal material may include but not limited to gold (Au) and nickel/gold (Ni/Au), etc. The metal oxide may include indium tin oxide (ITO), aluminum zinc oxide (AZO), gallium zinc oxide (GZO), or indium zinc oxide (IZO).

The first contact electrode 20a and the second contact electrode 30a include metal materials, such as chromium (Cr), titanium (Ti), tungsten (W), gold (Au), aluminum (Al), rhodium (Rh), indium (In), tin (Sn), nickel (Ni), platinum (Pt), silver (Ag) and other metals, or stacks or alloys of the above materials. In another embodiment, the light-emitting element 1 may further include a current blocking structure (not shown) located between the semiconductor stack 12 and the contact electrode. The material of the current blocking structure includes an insulating material blocking current from directly injecting into the semiconductor stack 12 below the contact electrode, thereby increasing current diffusion in a horizontal direction.

As shown in FIG. 1B, the insulating material stack 50 covers the surfaces of the semiconductor stack 12. In an embodiment, the insulating material stack 50 may be further extended to cover the upper surface 10a of the substrate 10. The structure of the insulating material stack 50 is described in detail below. The first semiconductor layer main surface 121a, the second semiconductor layer main surface 122a and the bottom surface 121b are substantially parallel to the XY plane. The first side surface S1 of the semiconductor stack 12 is located between the first semiconductor layer main surface 121a and the bottom surface 121b. The first side surface S1 is inclined to the XY plane. The second side surface S2 of the semiconductor stack 12 is located between the first semiconductor layer main surface 121a and the second semiconductor layer main surface 122a. The second side surface S2 is also inclined to the XY plane. In specific, a first included angle with an angle θ1 is formed between the first side surface S1 and the bottom surface 121b or the XY plane; a second included angle with an angle θ2 is formed between the second side surface S2 and the bottom surface 121b or the XY plane. The first included angle and the second included angle are acute angles, respectively. In an embodiment, the angle θ1 and angle θ2 are between 30 degrees and 60 degrees. Angle θ1 may be equal or not equal to the angle θ2. When θ1 is not equal to θ2, θ1 may be greater or less than θ2. Under the same area of the first semiconductor layer main surface 121a, when θ2 is greater than θ1, a larger active layer 123 can be at least retained to maximize the light-emitting area of the light-emitting element 1. In another embodiment (not shown), the insulating material stack 50 covers the first side surface S1 but does not cover the upper surface 10a of the substrate 10. In another embodiment (not shown), the insulating material stack 50 covers the second side surface S2 and the first semiconductor layer main surface 121a, but does not cover the first side surface S1 and the upper surface 10a of the substrate 10.

The first electrode pad 20 is located on the insulating material stack 50. The first electrode pad 20 is filled in the opening 501 of the insulating material stack 50 to form an electrical connection with the first semiconductor layer 121. The second electrode pad 30 is located on the insulating material stack 50. The second electrode pad 30 is filled in the opening 502 of the insulating material stack 50 to form an electrical connection with the second semiconductor layer 122. The first electrode pad 20 and the second electrode pad 30 include metal materials, such as chromium (Cr), titanium (Ti), tungsten (W), gold (Au), aluminum (Al), indium (In), tin (Sn), nickel (Ni), copper (Cu), rhodium (Rh), platinum (Pt), silver (Ag) and other metals, or a stack or an alloy of the above materials. For example, the first electrode pad 20 and the second electrode pad 30 may include an Al/Pt layer, a Ti/Au layer, a Ti/Pt/Au layer, a Cr/Au layer, a Cr/Pt/Au layer, a Ni/Au layer, a Ni/Pt/Au layer, Cr/Al/Ti/Pt layer, Ti/Al/Ti/Pt/Ni/Pt layer, Cr/Al/Ti/Al/Ni/Pt/Au layer, Cr/Al/Cr/Ni/Au layer or Ag/NiTi/TiW/Pt layer. The first electrode pad 20 and the second electrode pad 30 can serve as current paths for external power supply to the first semiconductor layer 121 and the second semiconductor layer 122.

In another embodiment (not shown), the light-emitting element 1 may be devoid of the substrate 10. In the manufacturing method of the light-emitting element 1, after the semiconductor stack 12 is formed on the substrate 10, the main surface 122a of the second semiconductor layer 122 may be fixed to a temporary carrier, and then the substrate 10 is separated from the semiconductor stack 12 to expose a surface of the first semiconductor stack 121 or a buffer structure. Next, the exposed surface of the first semiconductor stack 121 or the buffer structure is fixed to a carrier, and then the temporary carrier is separated from the semiconductor stack 12 to expose a surface of the second semiconductor stack 122. Then, as described in the above embodiment, a portion of the second semiconductor layer 122 and the active layer 123 is removed to form the first semiconductor layer main surface 121a. Similarly, the transparent conductive layer 18, the contact electrodes 20a and 30a, the insulating material stack 50, the first electrode pad 20 and the second electrode pad 30 may be formed on the semiconductor stack 12. In the above embodiments, the methods for removing the substrate 10 and the temporary carrier include but are not limited to etching and laser lift-off. The semiconductor stack 12 can be bonded to the temporary carrier or carrier board by glue bonding, but is not limited thereto. In another embodiment, forming the semiconductor stack 12 on the substrate 10, forming the transparent conductive layer 18 on the semiconductor stack 12, and fixing the upper surface of the transparent conductive layer 18 to a temporary carrier, and then the substrate 10 may be removed from the semiconductor stack 12, and subsequent processes as described above may be performed. In another embodiment, the forming sequence of the semiconductor stack 12 is different from the above-mentioned embodiments. The difference is that after the second semiconductor layer 122, the active layer 123, and the first semiconductor stack 121 are sequentially stacked on the substrate 10, the first semiconductor stack 121 may be directly fixed to the above carrier bypassing the temporary carrier. Then, the substrate 10 may be separated from the semiconductor stack 12 to expose the second semiconductor layer 122, and subsequent processes as described above may be performed. Similarly, the growth sequence of the layers in the semiconductor stack 12 can be determined according to a user's needs. For the light-emitting element 1 free of the substrate 10 formed according to the present embodiment, the semiconductor stack 12 of the light-emitting element 1 also includes the first side surface S1 and the second side surface S2 inclined to the XY plane.

Figure 2:
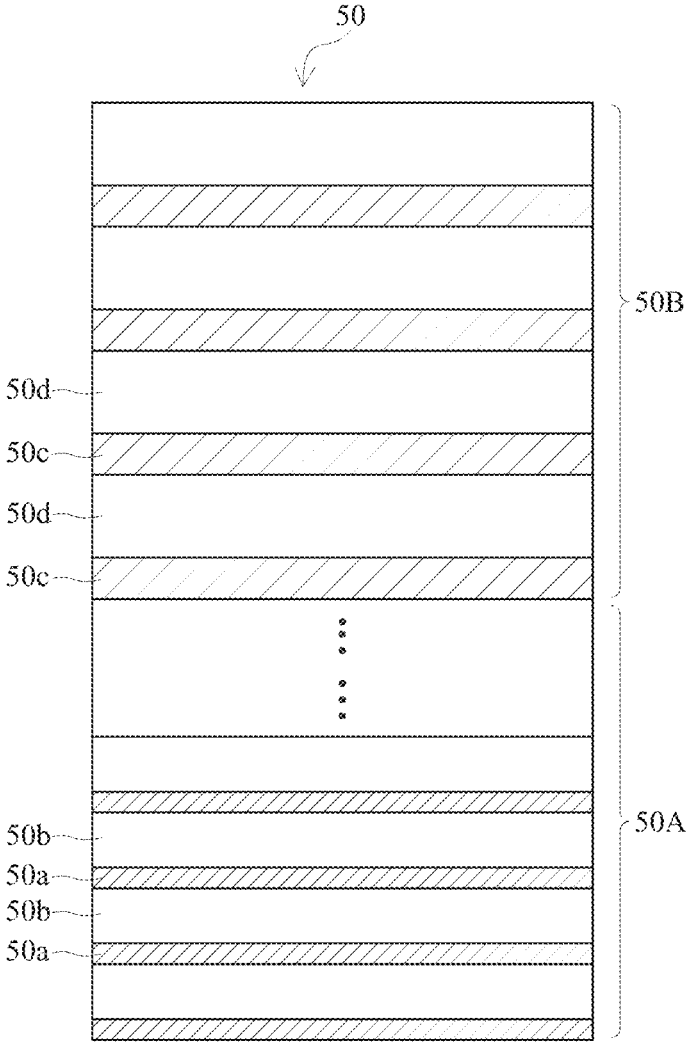
FIG. 2 shows the structure of the insulating material stack in accordance with an embodiment of the present application.

FIG. 1C shows a partial enlarged view of region R in FIG. 1B. FIG. 2 shows the structure of the insulating material stack in accordance with an embodiment of the present application. In order to clearly show the stacking of the insulating material stack 50, the patterned structure P is omitted from FIG. 1C. The insulating material stack 50 includes a plurality of alternately stacked pairs of material layers with different refractive indexes. By selecting materials with different refractive indexes and designing thicknesses thereof, the insulating material stack 50 provides a reflection function for light in a specific wavelength range and/or a specific incident angle range. That is, the insulating material stack 50 may serve as an insulating reflective structure.

As shown in FIG. 2, the insulating material stack 50 includes a first stack 50A and a second stack 50B. The first stack 50A includes one or more first insulating material pairs. Each first insulating material pair is composed of a first sub-layer 50a and a second sub-layer 50b. The second stack 50B includes one or more second insulating material pairs. Each second insulating material pair is composed of a third sub-layer 50c and a fourth sub-layer 50d. The first insulating material pairs and the second insulating material pairs may have the same or different pairs number. In order to clearly show the stacking of the insulating material stack 50, in FIG. C each of the first stack 50A and the second stack 50B is representatively shown by single insulating material pair.

The material of the insulating material stack 50 includes insulating materials, such as silicon oxide, silicon nitride, silicon oxynitride, niobium oxide, hafnium oxide, titanium oxide, magnesium fluoride, aluminum oxide. The first sub-layer 50a and the second sub-layer 50b may include different materials. For example, the refractive index of the material of the first sub-layer 50a is greater than that of the second sub-layer 50b. The third sub-layer 50c and the fourth sub-layer 50d may include different materials, for example, the refractive index of the material of the third sub-layer 50c is greater than that of the material of the fourth sub-layer 50d. In other words, each stack includes one or multiple pairs of insulating material pairs composed of high refractive index material layers and low refractive index material layers. The pairs number of the first insulating material pairs or the second insulating material pairs may be an integer or a half-integer. The half-integer pair means that the end layer in a stack is a half pair of insulating materials, that is, it only contains a high refractive index material layer or a low refractive index material layer. For example, the stacking sequence of the first stack 50A is first sub-layer/second sub-layer/ . . . /first sub-layer. In an embodiment, the first sub-layer 50a and the third sub-layer 50c include the same material, and the second sub-layer 50b and the fourth sub-layer 50d include the same material. The thickness of the first sub-layer 50a is less than the thickness of the third sub-layer 50c, and the thickness of the second sub-layer 50b is less than the thickness of the fourth sub-layer 50d. Unless otherwise specified, the thickness described in this specification is the physical thickness.

Figure 1D:
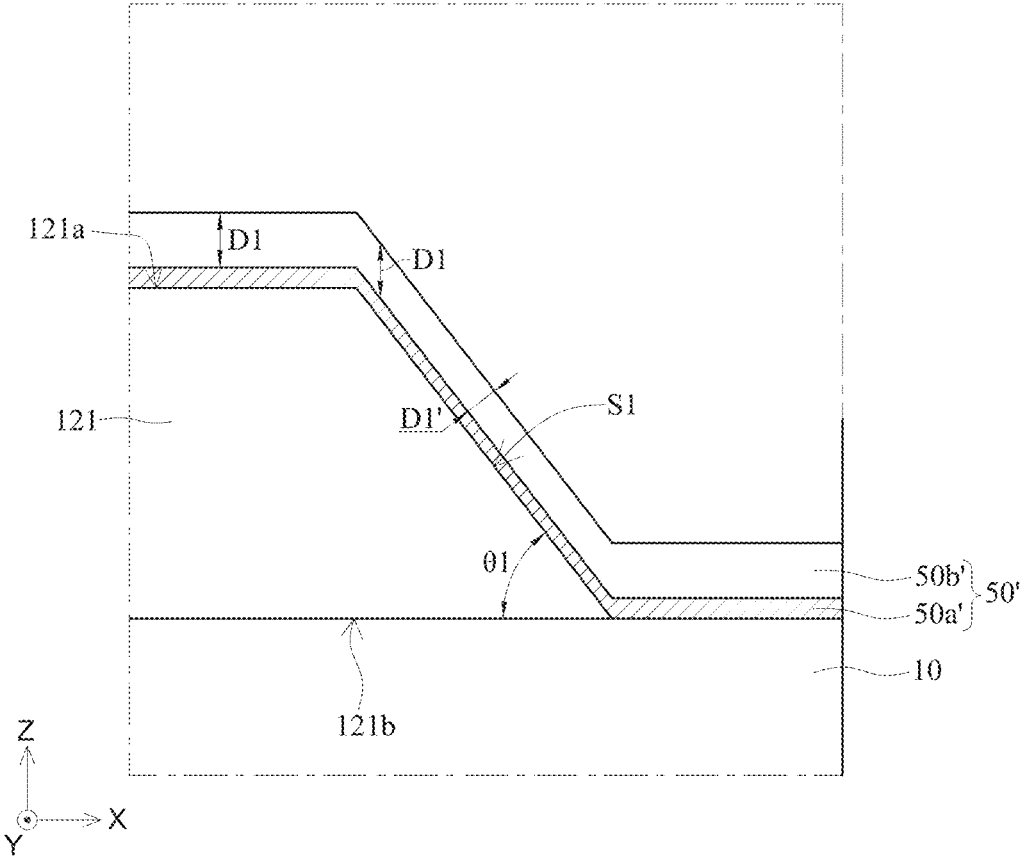
FIG. 1D shows a partial cross-sectional enlarged view of the light-emitting element of a first comparative example.

FIG. 1D shows a partial cross-sectional enlarged view of the light-emitting element of a first comparative example. An insulating material stack 50' including a first sub-layer 50a' and a second sub-layer 50b' is formed on the semiconductor stack. Referring to FIG. 1D, in general, in some film deposition methods, along the film deposition direction (i.e., the Z direction in the drawing), taking the second sub-layer 50b' as an example, the film thickness D1 on the first semiconductor layer main surface 121a and the film thickness D1 on the side surface may be adjusted to be consistent or approximately the same. However, the effective film thickness D1' on the side surface S1 may be less than the film thickness D1 being the effective film thickness on the first semiconductor layer main surface 121a. The effective thickness here refers to the thickness in the normal direction of the surface where the film layer is located. In the present specification, the above term "effective film thickness" is hereinafter simply referred to as "thickness". The thickness of the film layer on the side surface is related to the inclination angle θ1 of the side surface, that is, for the same film, the thickness of the film on the side surface=(the thickness of the film layer on the XY plane)×cos θ1. As a result, when the insulating material stack 50' serves as a reflective structure, the reflectivity of the insulating material stack 50' formed on the side surface may not be as good as expected. Furthermore, the reflectivity may be declined with different extents depending on the inclination angle θ1 of the side surface.

Referring to FIG. 1C, in order to offset the problem in the first comparative example that the effective thickness of the insulating material stack 50' on the side surface is insufficient to provide an expected reflectivity, the insulating material stack 50 in this embodiment includes a first part P1 located on the first semiconductor layer main surface 121a and a second part P2 located on the side surface S1. The first insulating pairs includes an average thickness d1 in the first part. The second insulating pairs includes an average thickness d2 in the first part P1. The first insulating material pair includes an average thickness d1' in the second part P2. The second insulating material pair includes average thickness d2' in the second part P2. In this embodiment, d1 and d2' may be close or equal. In an embodiment, the difference between d1 and d2' is less than 10%, in another embodiment, it is less than 5%, and in yet another embodiment, it is less than 1%. According to the embodiment of the present application, the first stack 50A and the second stack 50B can be designed according to the angle θ1 of the first side surface S1, that is, d1 is set as cos θ1×d2. In another embodiment, the preset angle θ1 of the first side surface S1 may vary slightly due to the manufacturing process. For example, if a variation within plus or minus 5 degrees during an etching process, the first stack 50A and the second stack 50B can be designed according to a relationship: $d1=\cos(\theta1\pm5)°\times d2$, therefore the reflectivity on the side surface can also be improved, that is, $\cos(\theta1+5)°\times d2 \le d1 \le \cos(\theta1-5)°\times d2$.

Figure 3A:
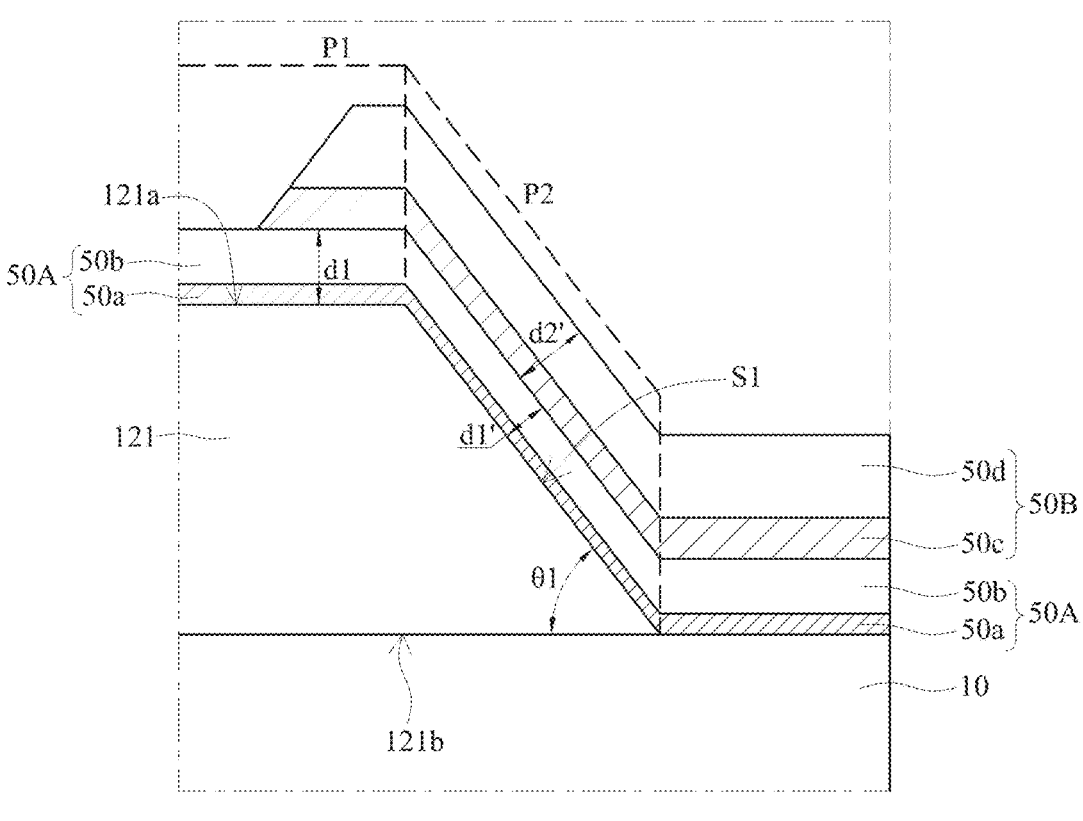
FIGS. 3A to 3C respectively show partial cross-sectional enlarged views of light-emitting devices according to other embodiments of the present application.
Figure 3B:
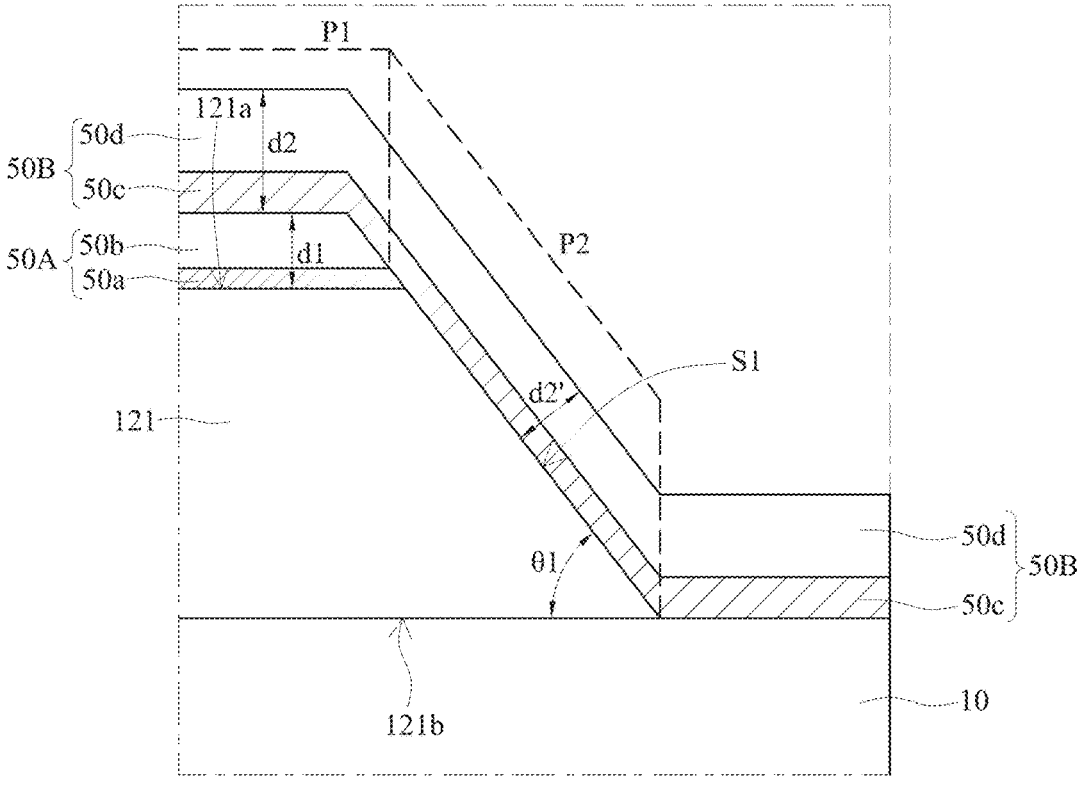
Figure 3C:
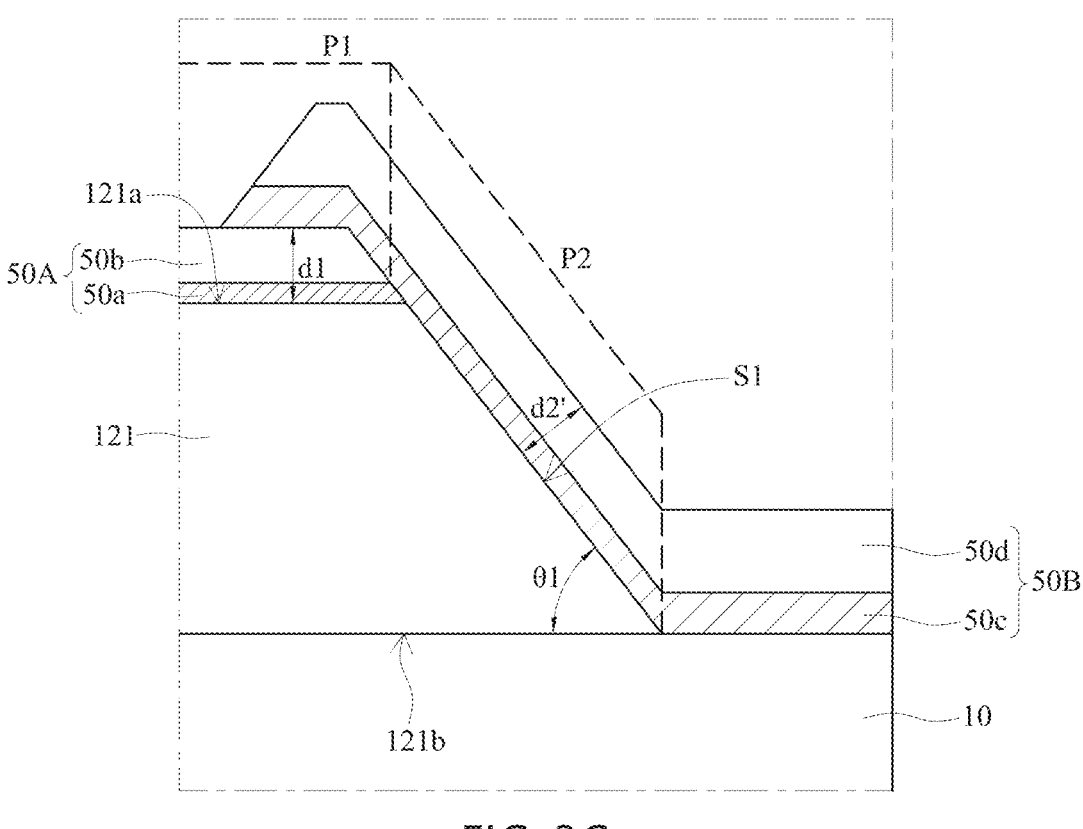

In an embodiment, the first part P1 and the second part P2 may not include both the first stack 50A and the second stack 50B. However, the first part P1 at least includes the first stack 50A and the second part P2 at least includes the second stack 50B. FIGS. 3A to 3C respectively show partial cross-sectional enlarged views of light-emitting devices according to other embodiments of the present application. Unlike the embodiment shown in FIG. 1C, the first part P1 and the second part P2 may be devoid of the first stack 50A and the second stack 50B. As shown in FIG. 3A, the first stack 50A covers the first semiconductor layer main surface 121a and the first side surface S1. The second stack covers the first side surface S1, and merely covers a portion of the first semiconductor layer main surface 121a or does not cover the first semiconductor layer main surface 121a. Either one of the first stack 50A and the second stack 50B covers the upper surface 10a of the substrate 10, or neither the first stack 50A nor the second stack 50B covers the upper surface 10a of the substrate 10. In an embodiment, the method of forming the structure of the above embodiment includes steps of: firstly forming the first stack 50A on the first semiconductor layer main surface 121a and the first side surface S1 by a photolithography process; covering the first semiconductor layer main surface 121a with a photoresist exposing the first stack 50A on the first side surface S1; forming the second stack 50B on the first stack 50A on the first side surface S1 and on the photoresist by coating; and removing the photoresist and a portion of the second stack 50B located on the photoresist. In another embodiment, the first stack 50A and the second stack 50B are sequentially formed on the first semiconductor layer main surface 121a and the first side surface S1, and a portion of the second stack 50B entirely located on first semiconductor layer main surface 121a, or a portion of the second stack 50B located on a specific region of the first semiconductor layer main surface 121a is removed by photolithography and etching processes, thereby forming the insulating material stack 50 of FIG. 3A.

As shown in FIG. 3B, the insulating material stack 50 includes a first stack 50A covering the first semiconductor layer main surface 121a without covering the first side surface S1; and a second stack 50B covering the first semiconductor layer main surface 121a and the first side surface S1. In an embodiment, the second stack 50B further covers the upper surface 10a of the substrate 10. In an embodiment, the method of forming the structure of the above embodiment includes steps of: firstly forming a photoresist covering the first side surface S1 by a photolithography process, and the photoresist exposes a portion of or entire of the first semiconductor layer main surface 121a; forming the first stack 50A on the first side surface S1; forming the second stack 50B on the first stack 50A on the first semiconductor layer main surface 121a and the first side surface S1; removing the photoresist and a portion of the first stack 50A located on the photoresist; and forming the second stack 50B on the first semiconductor layer main surface 121a and the first side surface S1, thereby forming the insulating material stack 50 of FIG. 3B. In another embodiment (not shown), the stacking sequence of the first stack 50A and the second stack 50B is opposite to that of FIG. 3B, that is, the second stack 50B and the first stack 50A are sequentially formed on the first semiconductor layer main surface 121 a and the first side surface S1, then the first stack 50A on the first side surface S1 is removed.

As shown in FIG. 3C, the first stack 50A covers the first semiconductor layer main surface 121a. The second stack 50B covers the first side surface S1 and merely covers a portion of the first semiconductor layer main surface 121a or does not cover the first side surface S1. Semiconductor layer main surface 121a. In an embodiment, the second stack 50B further covers the upper surface 10a of the substrate 10. In an embodiment, firstly the first stack 50A is formed on the first semiconductor layer main surface 121a and the first side surface S1, and then an etching or a photoresist lift-off processes are used to remove a portion of the first stack 50A located on entire or located on a specific region of the first side surface S1, and the second stack 50B is formed on the first side surface S1. In FIGS. 1C, 2, 3A and 3B, the first part P1 and the second part P2 of the insulating material stack 50 include different thicknesses.

In FIG. 1C, FIG. 2, and FIG. 3A to FIG. 3C, the second stack 50B is located above the first stack 50A. However, the embodiment of the present application is not limited thereto. The second stack 50B may be located below the first stack 50A. Those skilled in the art can adjust the forming order of the first stack 50A and the second stack 50B through the above-mentioned embodiments. In addition, although the first side surface S1 in FIG. 1C is taken as an example of the partial cross-sectional enlarged view of this embodiment, those skilled in the art shall understand from the disclosure of this embodiment that in order to make the insulating material stack 50 on the second side surface S2 reaches a target reflectivity, the insulating material stack 50 on the second side surface S2 can also be designed according to the second included angle θ2 in the manner disclosed above. Accordingly, the second part P2 of the insulating material stack 50 is located on the second side surface S2. In other embodiments, the insulating material stack 50 may be designed according to the first included angle θ1 or the second included angle θ2 based on the area occupied by the first side surface S1 and the second side surface S2. For example, when the area of the first side surface S1 is greater than the area of the second side surface S2, the light extraction area from the first side surface S1 is greater than the second side surface S2. Therefore, the first included angle θ1 is selected as a foundation for designing the first stack 50A and the second membrane stack 50B, and the second stack 50B may cover both the first side surface S1 and the second side surface S2. Furthermore, in FIG. 1C and FIGS. 3A to 3C, the first part P1 of the insulating material stack 50 is taken as an example of the insulating material stack 50 located on the first semiconductor layer main surface 121a. However, another insulating material stack 50 of the semiconductor stack 12 substantially parallel to the XY plane as the first semiconductor layer main surface 121a, for example, the insulating material stack 50 on the second semiconductor layer main surface 122a, the specific structure of such insulating material stack 50 is also the same as the first part P1 of the insulating material stack 50 as shown in FIGS. 1C and 1*n* FIGS. 3A-3C.

In an embodiment, the insulating material stack 50 may further include other inserted stacks (not shown) located before the first stack 50A and/or after the second stack 50B, or between the first stack 50A and the second stack 50B. The inserted stack is mainly used to eliminate or reduce the interference phenomenon of the reflection spectrum and improve the overall reflectivity. The inserted stack includes one or more insulating material pairs composed of high refractive index material layers and low refractive index material layers. The number of the insulating material pairs inserted into the stack can be an integer pair or a half-integer pair, and is less than the number of insulating material pairs of the first stack 50A or the second stack 50B. In an embodiment, the number of pairs of the insulating materials inserted into the stack does not exceed 3 pairs. In an embodiment, the average thickness difference between the insulating material pairs in the inserted stack and the second insulating material pair in the second stack 50B is more than 30% of the average thickness of the second insulating material pair in the second stack 50B.

In an embodiment, the insulating material stack 50 may further include a bottom layer (not shown) located on a side of the insulating material stack 50 facing the semiconductor stack 12. In other words, the bottom layer is first formed on the semiconductor stack 12, and then the first stack 50A and the second stack 50B are formed on the bottom layer. In an embodiment, the bottom layer includes an insulating material having a thickness greater than the thickness of the first sub-layer 50*a*, the thickness of the second sub-layer 50*b*, the thickness of the third sub-layer 50*c* and the thickness of the fourth sub-layer 50*d*. The bottom layer can provide a function of protecting the light-emitting element 1 or the semiconductor stack 12, such as blocking external moisture from entering the light-emitting element 1. In an embodiment, the forming method of the bottom layer is different from those of the first stack 50A and the second stack 50B. For example, the forming method of the bottom layer is chemical vapor deposition (CVD), specifically, is plasma enhanced chemical vapor deposition (PECVD). The first stack 50A and the second stack 50B are formed by Physical Vapor Deposition (PVD). In an embodiment, the first stack 50A is located between the second membrane stack 50B and the bottom layer. In another implementation, the second membrane stack 50B is located between the first membrane stack 50A and the bottom layer.

In another embodiment, the insulating material stack 50 may further include an upper layer (not shown) located on a side of the insulating material stack 50 opposite to the semiconductor stack 12. In other words, the first stack 50A and the second stack 50B are formed on the semiconductor stack 12, and then the upper layer is formed. The upper layer includes an insulating material including a thickness greater than the thickness of the first sub-layer 50*a*, the thickness of the second sub-layer 50*b*, the thickness of the third sub-layer 50*c* and the thickness of the fourth sub-layer 50*d*. In an embodiment, the forming method of the upper layer is different from that of the first stack 50A and the second stack 50B. For example, the forming method of the upper layer is chemical vapor deposition, specifically, is plasma enhanced chemical vapor deposition. The first stack 50A and the second stack 50B are formed by physical vapor deposition. In an embodiment, the upper layer can increase the strength of the entire insulating material stack 50. For example, when the insulating material stack 50 is subjected to an external force, the upper layer can prevent the insulating material stack 50 from being broken or damaged by the external force.

In an embodiment, the thickness of the insulating material stack 50 is between 1 μm and 5 μm, specifically between 1.5 μm and 3.5 μm. In an embodiment, the thickness of the insulating material stack 50 is greater than the thickness of the first contact electrode 20*a* and the second contact electrode 30*a*.

In another embodiment, before forming the insulating material stack 50, a dense layer (not shown) is formed on the surfaces of the transparent conductive layer 18 and the semiconductor stack 12 by atomic layer deposition (ALD) to be directly covered on the semiconductor layer 12. The material of the dense layer includes silicon oxide, aluminum oxide, hafnium oxide, tantalum oxide, zirconium oxide, yttrium oxide, lanthanum oxide, tantalum oxide, silicon nitride, aluminum nitride or silicon oxynitride. In this embodiment, the interface between the dense layer and the semiconductor stack 12 includes metal elements and oxygen. The metal elements include aluminum, hafnium, tantalum, zirconium, yttrium, lanthanum or tantalum. The dense layer includes a thickness between 50 Å and 2000 Å, specifically between 100 Å and 1500 Å. In an embodiment, the dense layer may conformally cover the semiconductor stack 12. The dense layer may provide an enhanced protection for the semiconductor stack 12 resulted from the film characteristics thereof having good step coverage. For example, water vapor can be prevented from entering the semiconductor stack 12 and adhesion between the insulating material stack 50 and the semiconductor stack 12 can be enhanced.

In another embodiment, the light-emitting element 1 may further include a reflective structure (not shown) disposed on the lower surface 10*b* of the substrate 10 to reflect the light emitted by the semiconductor stack 12, so that the light is mainly extracted from the side surface 10*c* of the substrate 10. Similar to the insulating material stack 50, the reflective structure includes one or more material layer pairs with different refractive indexes stacked alternately.

In another embodiment, the light-emitting element 1 may further include a metal reflective structure (not shown) disposed on one side of the insulating material stack 50 opposite to the semiconductor stack 12. The material of the metal reflective structure includes, for example, aluminum and silver. When the metal reflective structure is combined with the insulating material stack 50, an omni-directional reflector (ODR) can be realized to increase the brightness of the light-emitting element 1.

Figure 4:
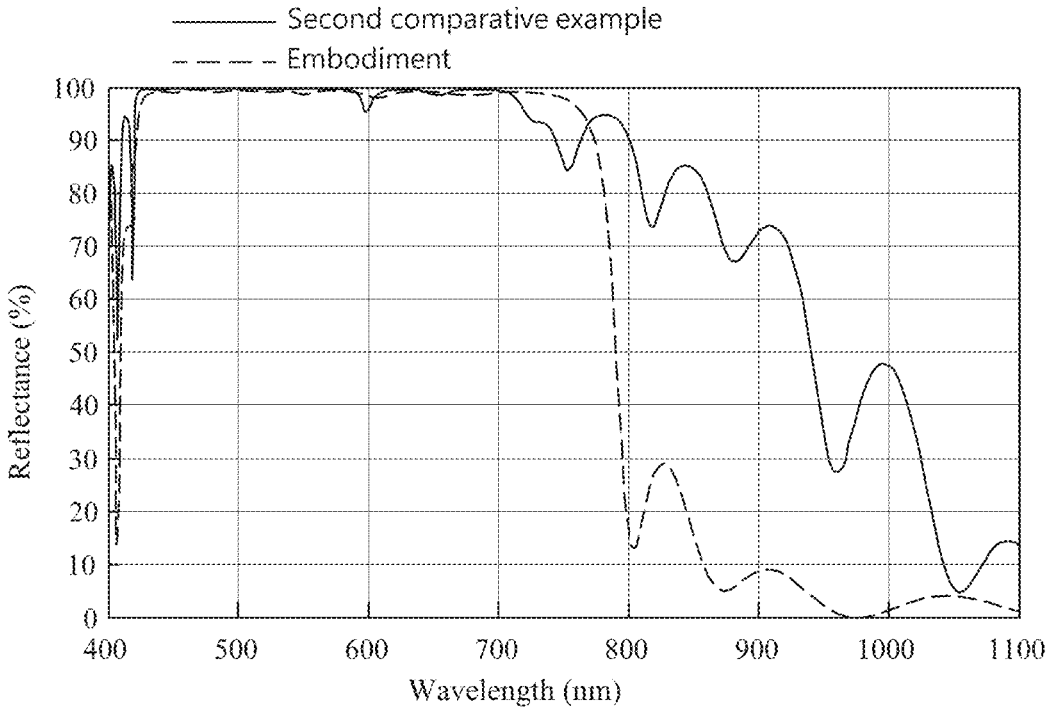
FIG. 4 shows the reflectivity of the embodiment of the present application and a second comparative example at different wavelengths.

FIG. 4 shows the reflectivity of the embodiment of the present application and a second comparative example at different wavelengths. Table 1 shows the insulating reflective structures of the embodiment and the second comparative example, where λ is the central wavelength of the visible light range. For example, the visible light range is between 400 nm and 700 nm, and the central wavelength is 550 nm. On the semiconductor stack, the insulating reflective structure of the second comparative example includes a first stack, a second stack and a third stack from bottom to top in order. In order to maximize the reflectivity in different wavelength ranges, the first stack has high reflectivity for a first wavelength range, the second stack has high reflectivity for a second wavelength range, and a third stack has high reflectivity for a third wavelength range. The first wavelength range is less than the second wavelength range, and the second wavelength range is less than the third wavelength range. The insulating reflective structure 50 of the embodiment includes a first stack, a second stack and an inserted stack from bottom to top on the semiconductor stack (the inserted stack is represented by the third stack in Table 1). The first stack and the second stack of the embodiment are designed according to the inclination angle of a side surface of the semiconductor stack, and the first included angle θ1 of the first side surface S1 is set to 42 degrees. Referring to FIG. 4, the second comparative example shows high reflectivity in a broad wavelength range, for example, a reflectivity of more than 60% can be maintained for a wavelength range between approximately 410 nm and 930 nm. The embodiment shows a reflectivity of greater than 60% in the wavelength range between approximately 410 nm and 790 nm.

TABLE 1

| Stack design | | Insulating reflective structure of the embodiment | Insulating reflective structure of second comparative example |
|---|---|---|---|
| Material | High refractive index materials | $TiO_2$ | $TiO_2$ |
| | Low refractive index materials | $SiO_2$ | $SiO_2$ |
| First stack | Pair number of the insulating materials | 6 | 8 |
| | Optical thickness t1 of low refractive index material layer | $(0.15\text{-}0.25)\lambda$ | $0.25\lambda \pm 10\%$ |
| | Optical thickness t2 of high refractive index material layer | $(0.15\text{-}0.25)\lambda$ | $0.2\lambda \pm 10\%$ |
| Second stack | Pair number of insulating materials | 6 | 7 |
| | Optical thickness t3 of low refractive index material layer | $(0.15\text{-}0.25)\lambda/\cos42°$ | $0.35\lambda \pm 10\%$ |
| | Optical thickness t4 of high refractive index material layer | $(0.15\text{-}0.25)\lambda/\cos42°$ | $0.2\lambda \pm 10\%$ |
| Third stack | Pair number of the insulating materials | 1 | 3 |
| | Optical thickness t5 of low refractive index material layer | $0.4\lambda \pm 10\%$ | $0.4\lambda \pm 10\%$ |
| | Optical thickness t6 of high refractive index material layer | $0.5\lambda \pm 10\%$ | $0.3\lambda \pm 10\%$ |
| | Total physical thickness | 2.10 μm | 3.01 μm |

Figure 5A:
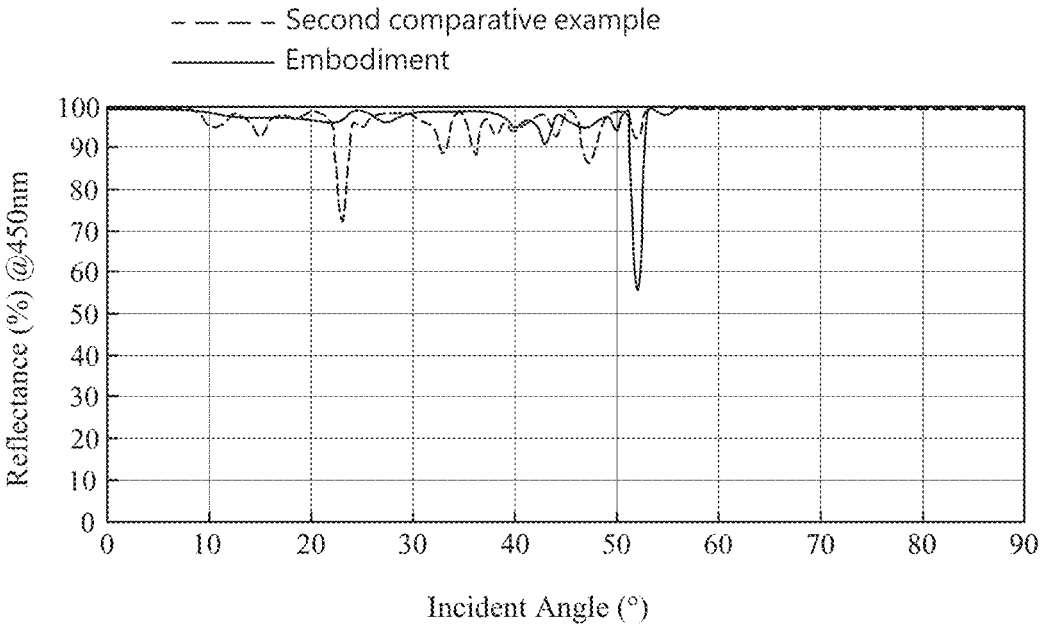
FIGS. 5A, 5B, 5C, and 5D show the reflectivity of the embodiments of the present application and the second comparative example at different incident angles.
Figure 5B:
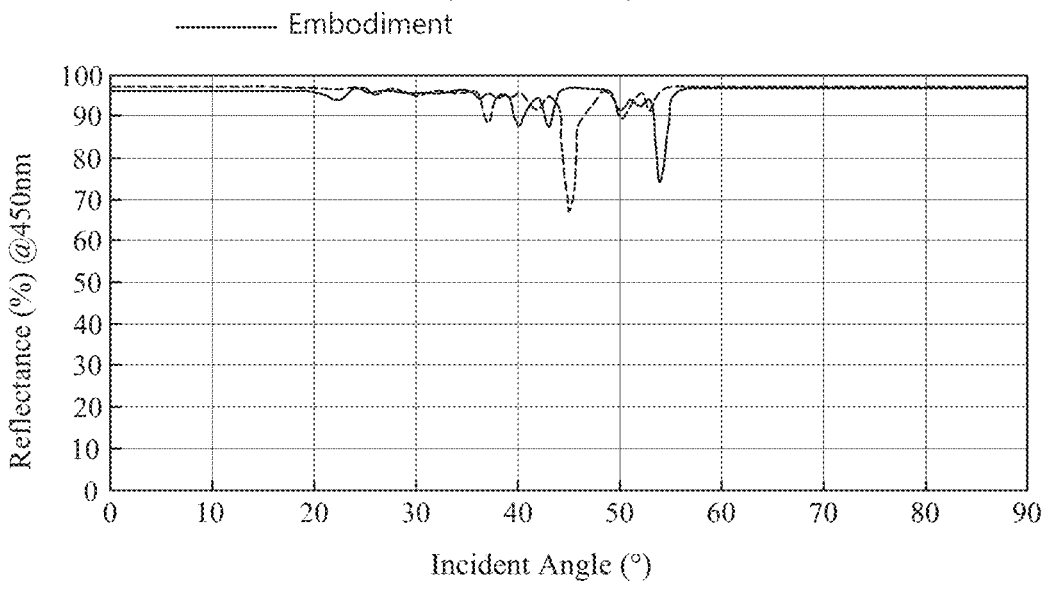

FIGS. 5A and 5B show the experimental simulation results of light reflectivity at different incident angles of light of the embodiments of the present application and the second comparative example. It should be noted that FIG. 5A shows the reflectivity of the insulating reflective structure 50 on the first side surface S1 of the semiconductor stack 12 for light with a wavelength of 450 nm, which can be regarded as the reflectivity of the second part P2 of the insulating reflective structure 50. FIG. 5B shows the reflectivity of the insulating reflective structure 50 on the XY plane for light with a wavelength of 450 nm, which can be regarded as the reflectivity of the first part P1 of the insulating reflective structure 50.

According to FIG. 5A, the second comparative example shows that the light incident angle in a range of 0 degrees to 50 degrees has multiple sections where the reflectivity drops to below 90%. The embodiment shows a reflectivity-decreasing region corresponding to a light incident angle of about 52 degrees. However, compared with the second comparative example, the reflectivity of the embodiment decreases due to the change of the light incident angle in a smaller section. In addition, when the light incident angle of the embodiment is within a range between 0 and 30 degrees, 0 and 40 degrees, or 0 and 50 degrees, a higher reflectivity can be maintained, such as a reflectivity of more than 90%, or a reflectivity of more than 95%. Therefore, the overall reflectivity on the side surface of the semiconductor stack of the embodiment is better than that of the second comparative example. Referring to FIG. 5B, the overall reflectivity on the XY plane, such as the overall reflectivity on the main surface 121a of the first semiconductor layer main surface 121a and the second semiconductor layer main surface 122a of the embodiment, is equivalent to that of the second comparative example. The insulating reflective structures of the above embodiments and the second comparative example may be respectively formed on the same light-emitting elements emitting a dominant wavelength or a peak wavelength of 450 nm. Compared with the light-emitting element of the second comparative example, the brightness of the light-emitting element of the embodiment is raised by 0.3% to 0.4%.

Figure 5C:
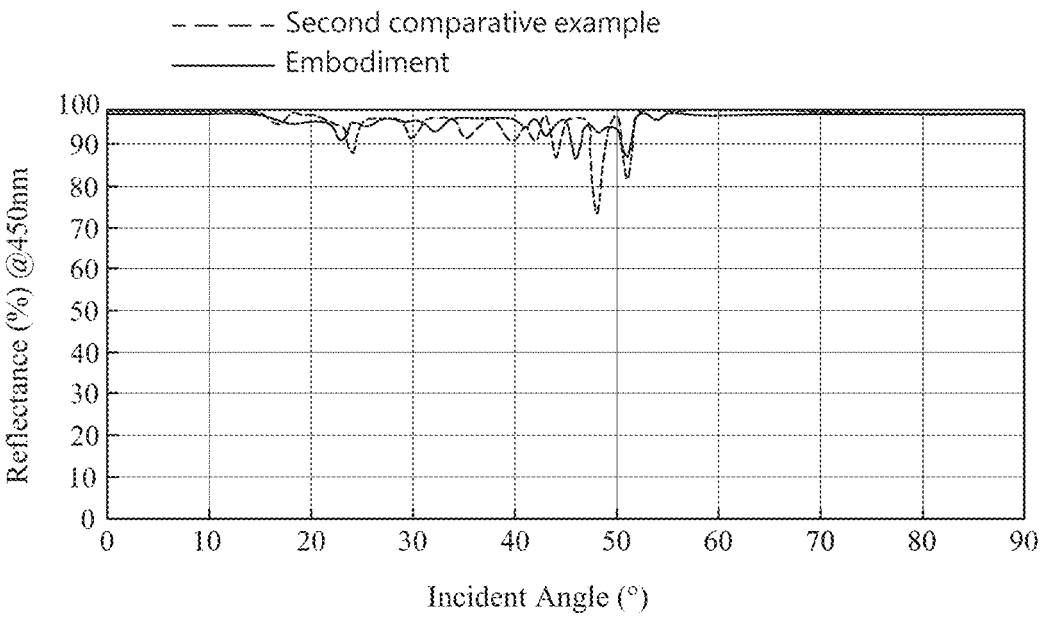
Figure 5D:
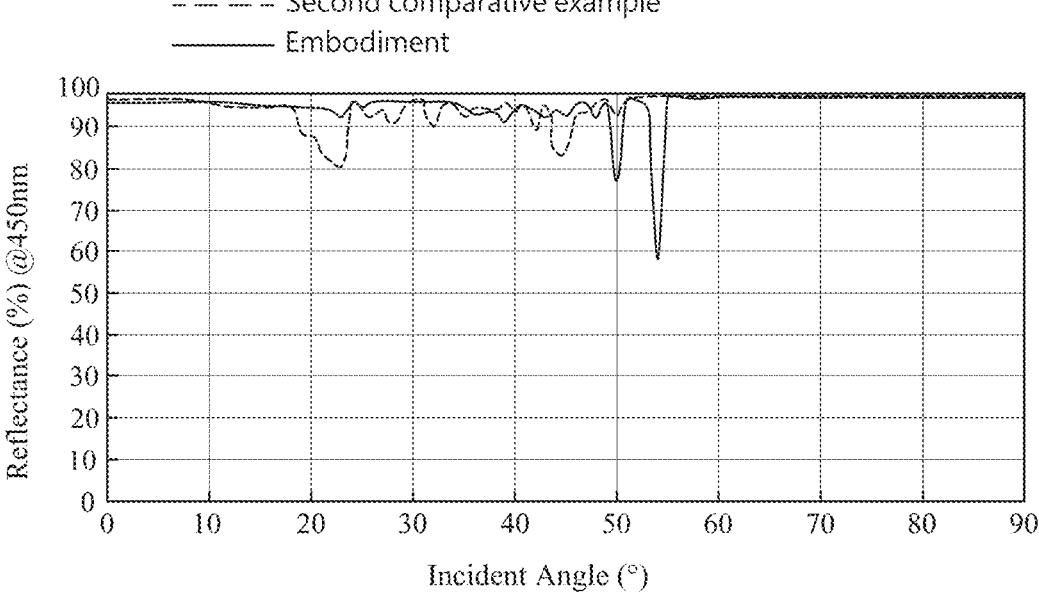

FIGS. 5C and 5D show the experimental simulation results of the reflectivity at different incident angles of light of the embodiments of the present application and the second comparative example for a light with wavelength of 450 nm. In particular, FIG. 5C and FIG. 5D respectively show the reflectivity experimental simulation results of the second part P2 of the insulating reflective structure 50 of the embodiment and the second comparative example when a deviation is between the preset value and the actual value of the inclined angle of the side surface of the semiconductor stack. FIG. 5C shows a condition when the preset value of the inclined angle of the side surface of the semiconductor stack is 42 degrees as mentioned above, while the actual value thereof is 37 degrees, that is, the deviation is −5 degrees. FIG. 5D shows a condition when the actual value of inclined angle of the side surface of the semiconductor stack is 47 degrees, that is, the deviation is +5 degrees. According to FIG. 5C and FIG. 5D, compared with the second comparative example, the reflectivity of the embodiment is less affected by incident angle variation of light, and the overall reflectivity thereof is better. In addition, based on above experiments, even the preset inclines angle of the side surface of the semiconductor stack of an actual light-emitting element may slightly varies due to the manufacturing process. In the embodiment, the range of the light incident angle is between 0 degrees and 30 degrees, or 0 degrees and 45 degrees, and a high reflectivity may still be maintained, such as a reflectivity of more than 90% or 95%.

Based on the above reflectivity simulation experiments and comparisons of actual light-emitting elements, apparently, the insulating reflective structure 50 of the embodiments of the present application can achieve better reflectivity on the side surface of the semiconductor stack, and the reflectivity on the XY plane of the semiconductor stack is comparable to that of the second comparative example. Therefore, in an actual light-emitting element, the light-emitting elements of the embodiments of the present application can achieve improved brightness. Conventionally, in order to achieve a higher overall reflectivity, an insulating reflective structure with a greater pair number of insulating materials may be used, or the high reflectivity wavelength range of the insulating reflective structure may be broadened. However, in the embodiments of the present application, the insulating reflective structure is designed according to the inclined angle of the side surface of the semiconductor stack. Compared with the second comparative example, the insulating reflective structure 50 of the embodiments have less pairs of insulating materials. Even the high reflectivity wavelength range is narrower, the light-emitting element can still achieve higher brightness. In addition, the total physical thickness of the insulating reflective structure of each of the embodiments is thinner than that of the second comparative example. For example, it can be seen from Table 1 that the total physical thickness of the insulating reflective structure of this embodiment is reduced by 0.91 μm compared with the second comparative example, therefore the manufacturing cost and process time can be reduced. The above experiments and the insulating reflective structure 50 are explained for a light-emitting element emitting a dominant wavelength or a peak wavelength of 450 nm. Those skilled in the art can understand based on the content disclosed in this application, the insulating reflective structure 50 can be designed and manufactured according to the inclined angle of the side surface of the semiconductor stack and the light-emitting elements with different emission wavelengths.

Figure 6:
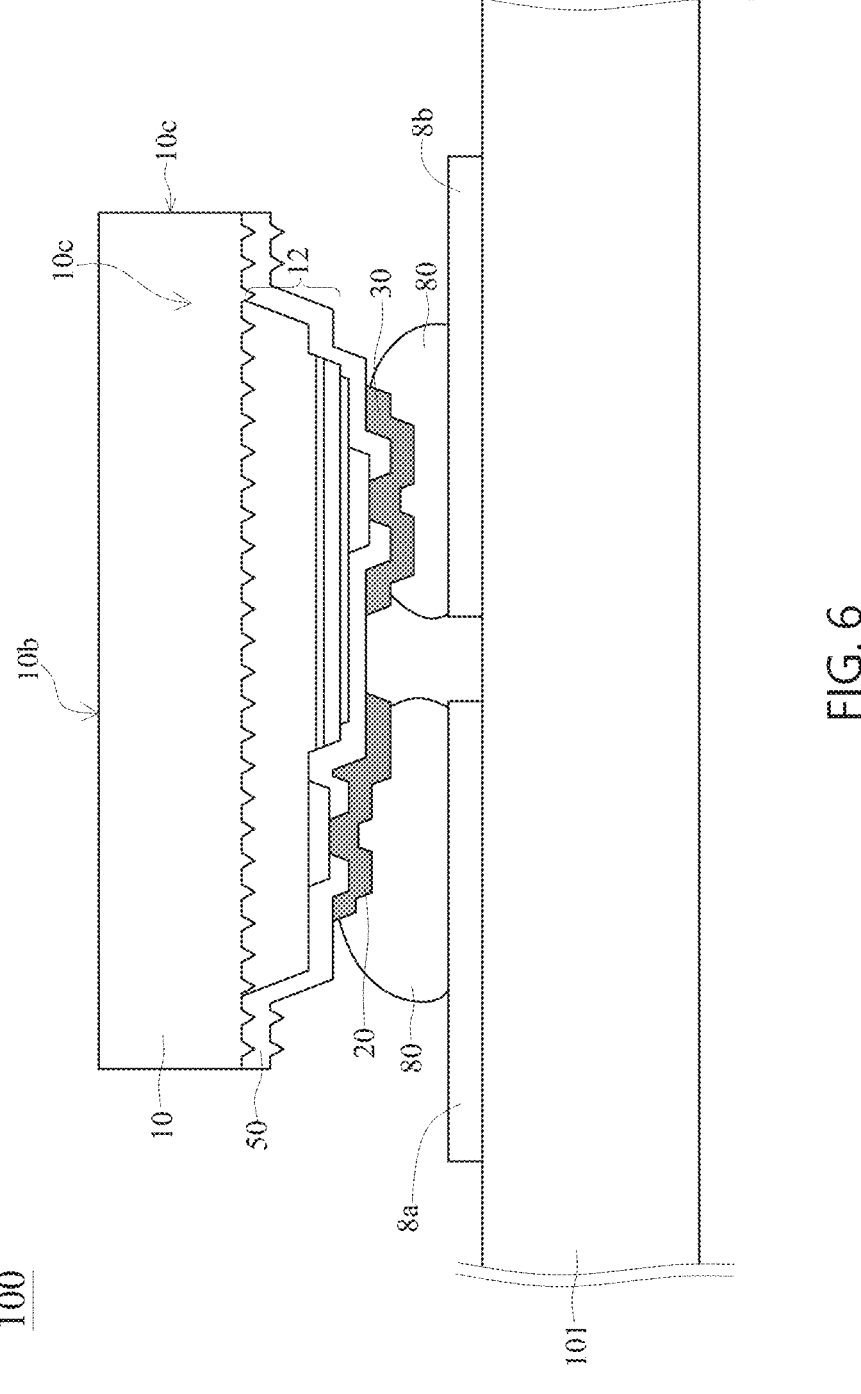
FIG. 6 shows a light-emitting module including the light-emitting element according to an embodiment of the present application.

FIG. 6 shows a light-emitting module 100 including the light-emitting element 1 according to an embodiment of the present application. The light-emitting module 100 includes a carrier board 101. a circuit bonding pad 8a and a circuit bonding pad 8b are provided on the carrier board 101. The first electrode pad 20 and the second electrode pad 30 of the light-emitting element 1 are respectively bonded to the circuit bonding pad 8a and the circuit bonding pad 8b by a conductive bonding layer 80 via a flip-chip manner. In an embodiment, the bonding method may include but are not limited to eutectic bonding, solder bonding and adhesive bonding. The conductive bonding layer 80 includes a eutectic metal layer, metal solder and conductive adhesive. In this way, the light emitted by the semiconductor stack 12 is mainly extracted through the lower surface 10b and the side surface 10c of the substrate 10. In an embodiment, the light-emitting module 100 may further include a transparent adhesive material (not shown) located on the carrier 101 to cover the light-emitting element 1. The transparent adhesive material includes silicone, epoxy, acrylic or mixtures thereof. In an embodiment, the light-emitting element 1 further includes a reflective structure (not shown) disposed on the lower surface 10b of the substrate 10 to reflect the light emitted by the semiconductor stack 12, so that the light is mainly extracted from the side surface 10c of the substrate 10. In an embodiment, the reflective structure includes a pair or multiple pairs of material layers with different refractive indexes stacked alternately.

Figure 7:
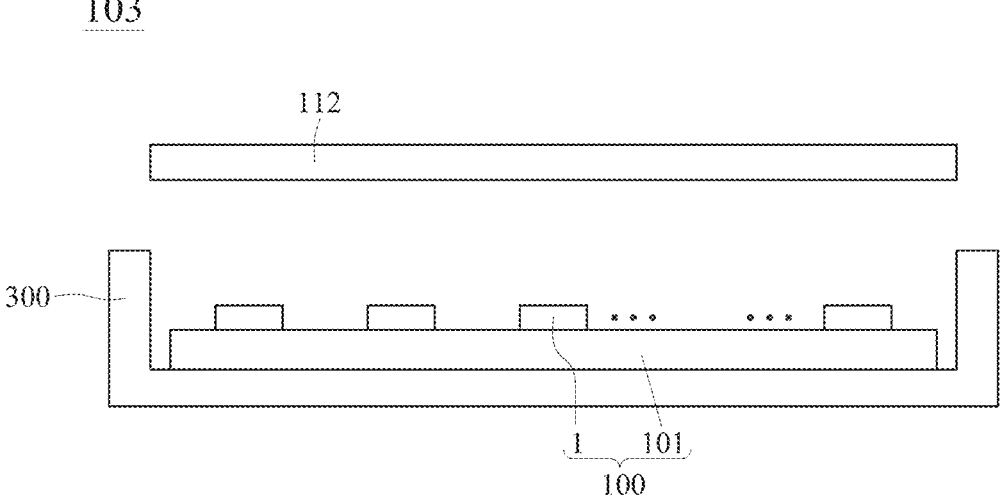
FIG. 7 shows a display backlight unit including the light-emitting element according to an embodiment of the present application.

FIG. 7 shows a schematic cross-sectional view of a display backlight unit 103. The display backlight unit 103 includes the light-emitting element 1 of any of the above-mentioned embodiments. The display backlight unit 103 includes a housing 300 that accommodates the light-emitting module 100 as shown in FIG. 3. The optical film 112 is disposed above the light-emitting module 100. The optical film 112 may be a light diffuser. In the embodiment, the display backlight unit 103 is a direct backlight unit. The light-emitting module 100 includes a carrier board 101, and the light-emitting elements 1 according to any embodiment of the present application are mounted and arranged on the carrier board 101. In another embodiment (not shown), the light-emitting module 100 includes the carrier board 101 and a plurality of light-emitting element packages mounted and arranged on the carrier board 101. The light-emitting element of any of the above embodiments is encapsulated in the light-emitting element package and is mounted on the upper surface of the carrier board 101 in a flip-chip manner.

It is noted that each of the embodiments listed in the present application is merely used to describe the present application, not limiting the scope of the present application. It will be apparent to any one that obvious modifications or variations can be made to the devices in accordance with the present disclosure without departing from the spirit and scope of the present application. Identical or similar components in different embodiments or the components having identical reference numerals in different embodiments have identical physical properties or chemical properties. In addition, under suitable circumstances, the above-mentioned embodiments in the present application may be combined or replaced with each other, not limiting to the specific embodiments described above. In an embodiment, the connecting relationship of the specific component and other component described in detail may also be applied into other embodiments, falling within the scope of the following claims and their equivalents of the present application.

What is claimed is:

1. A light-emitting element, comprising:
a semiconductor stack, comprising:
   a main surface, a bottom surface and a side surface between the main surface and the bottom surface, the side surface is inclined to the main surface and has an acute included angle with θ degrees with the bottom surface;
an insulating reflective structure, covering the semiconductor stack and comprising a first stack and a second stack, wherein the first stack comprises one or more first insulating pairs each composed of a first sub-layer and a second sub-layer, and the second stack comprises one or more second insulating pairs each composed of a third sub-layer and a fourth sub-layer;
wherein the first sub-layer and the second sub-layer comprise different materials, and the third sub-layer and the fourth sub-layer comprise different materials, and a thickness of the first sub-layer is less than that of the third sub-layer, and a thickness of the second sub-layer is less than that of the fourth sub-layer;
an opening, formed in the insulating reflective structure; and
an electrode, located on the insulating reflective structure, filled in the opening and electrically connecting the semiconductor stack;
wherein:
the light-emitting device comprises a dominant wavelength and a peak wavelength;
the insulating reflective structure comprises: a first part located on the main surface and comprising a first thickness; and a second part located on the side surface and comprising a second thickness different from the first thickness; and
the second part of the insulating reflective structure comprises a reflectivity of more than 90% for the dominant wavelength or the peak wavelength within an incident angle of 0° to 30°.

2. The light-emitting element according to claim 1, wherein the first insulating pairs comprise an average thickness $d1$ in the first part, the second insulating pairs comprise an average thickness $d2$ in the first part, wherein $\cos(\theta+5)°×d2 \leq d1 \leq \cos(\theta-5)°×d2$.

3. The light-emitting element according to claim 2, wherein the first part is devoid of the second stack, and/or the second part is devoid of the first stack.

4. The light-emitting element according to claim 2, wherein the first part comprises the first stack and the second stack, and the second part comprises the first stack and the second stack.

5. The light-emitting element according to claim 4, wherein the second thickness is less than the first thickness.

6. The light-emitting element according to claim 1, wherein the first insulating pairs comprise an average thickness d1 in the first part, the second insulating pairs comprises an average thickness d2' in the second part, the difference between d1 and d2' is less than 10%.

7. The light-emitting element according to claim 1, wherein the acute included angle θ is between 30 degrees and 60 degrees.

8. The light-emitting element according to claim 1, further comprising a substrate comprising an upper surface connecting the bottom surface, wherein the insulating reflective structure further covers the upper surface.

9. The light-emitting element according to claim 1, wherein the first sub-layer and the third sub-layer comprise the same materials, the second sub-layer and the fourth sub-layer comprise the same materials.

10. The light-emitting element according to claim 1, wherein the insulating reflective structure further comprises an inserted stack located between the first stack and the semiconductor stack, located on the second stack, or located between the first stack and the second stack.

11. A light-emitting device, comprising:
a semiconductor stack, comprising:
   a main surface, a bottom surface and a side surface between the main surface and the bottom surface, the side surface is inclined to the main surface and has an acute included angle with θ degrees with the bottom surface;
an insulating reflective structure, covering the semiconductor stack and comprising a first stack and a second stack, wherein the first stack comprises one or more first insulating pairs each composed of a first sub-layer and a second sub-layer, and the second stack comprises one or more second insulating pairs each composed of a third sub-layer and a fourth sub-layer;
wherein the first sub-layer and the second sub-layer comprise different materials, and the third sub-layer and the fourth sub-layer comprise different materials, and a thickness of the first sub-layer is less than that of the third sub-layer, and a thickness of the second sub-layer is less than that of the fourth sub-layer;

an opening, formed in the insulating reflective structure; and an electrode, located on the insulating reflective structure, filled in the opening and electrically connecting to the semiconductor stack;

wherein the insulating reflective structure comprises:

a first part located on the main surface; and a second part located on the side surface, the first insulating pairs comprise an average thickness d1 in the first part, the second insulating pairs comprises an average thickness d2' in the second part, the difference between d1 and d2' is less than 10%.

12. The light-emitting element according to claim 11, wherein the difference between d1 and d2' is less than 5%.

13. The light-emitting element according to claim 11, wherein the insulating reflective structure further comprises an inserted stack located between the first stack and the semiconductor stack, located on the second stack, or located between the first stack and the second stack.

14. The light-emitting element according to claim 11, wherein the acute included angle θ is between 30 degrees and 60 degrees.

15. The light-emitting element according to claim 11, further comprising a substrate comprising an upper surface connecting to the bottom surface, wherein the insulating reflective structure further covers the upper surface.

16. The light-emitting element according to claim 11, wherein the first sub-layer and the third sub-layer comprise the same materials, the second sub-layer and the fourth sub-layer comprise the same materials.

17. A light-emitting module comprising:
a carrier board; and
the light-emitting element of claim 1, electrically connected to the carrier board.

18. A light-emitting module comprising:
a carrier board; and
the light-emitting element of claim 11, electrically connected to the carrier board.

19. A display backlight unit, comprising:
a housing;
the light-emitting module of claim 17, accommodated in the house; and
an optical film, disposed above the light-emitting module.

20. A display backlight unit, comprising:
a housing;
the light-emitting module of claim 18, accommodated in the house; and
an optical film, disposed above the light-emitting module.

\* \* \* \* \*